(12) United States Patent
Kariyada

(10) Patent No.: US 12,089,502 B2
(45) Date of Patent: Sep. 10, 2024

(54) MAGNETORESISTANCE EFFECT ELEMENT, STORAGE ELEMENT, AND ELECTRONIC DEVICE

(71) Applicant: Sony Semiconductor Solutions Corporation, Kanagawa (JP)

(72) Inventor: Eiji Kariyada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 515 days.

(21) Appl. No.: 17/419,414

(22) PCT Filed: Jan. 8, 2020

(86) PCT No.: PCT/JP2020/000357
§ 371 (c)(1),
(2) Date: Jun. 29, 2021

(87) PCT Pub. No.: WO2020/158323
PCT Pub. Date: Aug. 6, 2020

(65) Prior Publication Data
US 2022/0077387 A1 Mar. 10, 2022

(30) Foreign Application Priority Data
Jan. 30, 2019 (JP) ................................ 2019-014595

(51) Int. Cl.
*H01L 27/22* (2006.01)
*H10B 61/00* (2023.01)
(Continued)

(52) U.S. Cl.
CPC ............. *H10N 50/10* (2023.02); *H10B 61/00* (2023.02); *H10N 50/80* (2023.02); *H10N 50/85* (2023.02)

(58) Field of Classification Search
CPC ........ H10N 50/10; H10N 50/80; H10N 50/85; H10N 70/841–8418; H10B 99/00;
(Continued)

(56) References Cited

U.S. PATENT DOCUMENTS 8,750,029 B2    6/2014  Kitagawa et al.
2013/0069182 A1* 3/2013  Ohsawa ................. H10N 50/10
                                                 257/E21.665
(Continued)

FOREIGN PATENT DOCUMENTS

JP    2012-160681 A   8/2012
JP        5148673 B   2/2013
(Continued)

OTHER PUBLICATIONS

International Search Report issued in International Patent Application No. PCT/JP2020/000357 on Mar. 24, 2020 and English translation of same. 6 pages.

(Continued)

*Primary Examiner* — Shahed Ahmed
(74) *Attorney, Agent, or Firm* — K&L Gates LLP

(57) ABSTRACT

Provided is a magnetoresistance effect element configured by laminating a first electrode, a magnetization pinned layer having a fixed magnetization direction, a first insulating layer, a magnetization free layer having a variable magnetization direction, a second insulating layer, and a second electrode in order, in which the magnetization pinned layer includes a first magnetic body provided on the first electrode, and a second magnetic body provided on the first magnetic body via a non-magnetic metal layer, at least any of the first magnetic body and the second magnetic body is configured by providing a magnetic layer directly above a non-magnetic layer, and either the non-magnetic layer or the
(Continued)

magnetic layer is formed in a multilayer structure in which different materials are alternately laminated.

14 Claims, 17 Drawing Sheets

(51) Int. Cl.
  *H10N 50/10* (2023.01)
  *H10N 50/80* (2023.01)
  *H10N 50/85* (2023.01)

(58) Field of Classification Search
  CPC ............ H10B 61/00–22; G11C 11/161; G11C 2211/5615; G11C 11/14–1697; H01F 10/08; H01F 10/26; H01L 27/105
  See application file for complete search history.

(56) References Cited

U.S. PATENT DOCUMENTS

| | | | |
|---|---|---|---|
| 2015/0318466 A1* | 11/2015 | Shimane | ................. C23C 8/10 |
| | | | 118/728 |
| 2018/0123025 A1 | 5/2018 | Lee | |
| 2019/0013460 A1* | 1/2019 | Ikegawa | ................. H01F 41/32 |

FOREIGN PATENT DOCUMENTS

| | | | |
|---|---|---|---|
| JP | 2013-069788 A | 4/2013 | |
| JP | 2017-505533 A | 2/2017 | |

OTHER PUBLICATIONS

Written Opinion issued in International Patent Application No. PCT/JP2020/000357 on Mar. 24, 2020. 4 pages.

* cited by examiner

MAGNETORESISTANCE EFFECT ELEMENT, STORAGE ELEMENT, AND ELECTRONIC DEVICE

TECHNICAL FIELD

The present disclosure relates to a magnetoresistance effect element, a storage element, and an electronic device.

BACKGROUND ART

In recent years, in semiconductor devices, it has become common to consolidate a large-capacity non-volatile memory into a logic circuit using a complementary MOS (CMOS).

For example, consolidating a static random access memory (SRAM) or the like into a logic circuit is performed. On the other hand, in order to reduce costs and power consumption for a semiconductor device, replacing an SRAM with a magnetoresistive random access memory (MRAM) is being studied.

A magnetoresistive random access memory (MRAM) is a storage element that uses a magnetoresistance effect element in which an insulating thin film is sandwiched between a pair of ferromagnetic layers. In the magnetoresistance effect element, a magnitude of a tunnel resistance changes depending on relative magnetization directions of the pair of ferromagnetic layers. As a result, the MRAM can store information by controlling magnetizations of the ferromagnetic layers of the magnetoresistance effect element such that they are either parallel or antiparallel and controlling the magnitude of the tunnel resistance.

Here, in a perpendicular magnetization type magnetoresistance effect element having magnetic anisotropy in a direction perpendicular to a film surface, various laminated structures are being studied in order to enhance the perpendicular magnetic anisotropy of a ferromagnetic layer.

For example, PTL 1 below discloses that, in a perpendicular magnetization type magnetoresistance effect element having magnetic anisotropy in a direction perpendicular to a film surface, an underlayer containing Pd (palladium) having a concentration equal to or less than a certain concentration is provided under a recording layer of which a magnetization direction is variable. PTL 1 discloses that Co (cobalt) and Pd, which are ferromagnetic metals contained in a storage layer, are alloyed, so that a higher MR ratio can be realized.

CITATION LIST

Patent Literature

[PTL 1]
JP 5148673 B

SUMMARY

Technical Problem

However, in PTL 1, the crystal orientation of a ferromagnetic layer has not been sufficiently studied. In a case in which the crystal orientation of the ferromagnetic layer is low, it becomes difficult to further enhance the perpendicular magnetic anisotropy of the ferromagnetic layer. For that reason, there is a possibility that a magnetoresistance effect element having a higher perpendicular magnetic anisotropy in the ferromagnetic layer could be realized by focusing on the crystal orientation of the ferromagnetic layer.

Solution to Problem

According to the present disclosure, provided is a magnetoresistance effect element including: a first electrode; a magnetization pinned layer that is provided on the first electrode and has a fixed magnetization direction; a first insulating layer provided on the magnetization pinned layer; a magnetization free layer that is provided on the first insulating layer and has a variable magnetization direction; a second insulating layer provided on the magnetization free layer; and a second electrode provided on the second insulating layer, in which the magnetization pinned layer includes a first magnetic body provided on the first electrode, and a second magnetic body provided on the first magnetic body via a non-magnetic metal layer, at least any of the first magnetic body and the second magnetic body is configured by providing a magnetic layer directly above a non-magnetic layer, and either the non-magnetic layer or the magnetic layer is formed in a multilayer structure in which different materials are alternately laminated.

Also, according to the present disclosure, provided is a storage element including: a first electrode; a magnetization pinned layer that is provided on the first electrode and has a fixed magnetization direction; a first insulating layer provided on the magnetization pinned layer; a magnetization free layer that is provided on the first insulating layer and has a variable magnetization direction; a second insulating layer provided on the magnetization free layer; and a second electrode provided on the second insulating layer, in which the magnetization pinned layer includes a first magnetic body provided on the first electrode, and a second magnetic body provided on the first magnetic body via a non-magnetic metal layer, at least any of the first magnetic body and the second magnetic body is configured by providing a magnetic layer directly above a non-magnetic layer, and either the non-magnetic layer or the magnetic layer is formed in a multilayer structure in which different materials are alternately laminated.

Also, according to the present disclosure, provided is an electronic device including a magnetoresistance effect element, the magnetoresistance effect element including: a first electrode; a magnetization pinned layer that is provided on the first electrode and has a fixed magnetization direction; a first insulating layer provided on the magnetization pinned layer; a magnetization free layer that is provided on the first insulating layer and has a variable magnetization direction; a second insulating layer provided on the magnetization free layer; and a second electrode provided on the second insulating layer, in which the magnetization pinned layer includes a first magnetic body provided on the first electrode, and a second magnetic body provided on the first magnetic body via a non-magnetic metal layer, at least any of the first magnetic body and the second magnetic body is configured by providing a magnetic layer directly above a non-magnetic layer, and either the non-magnetic layer or the magnetic layer is formed in a multilayer structure in which different materials are alternately laminated.

DESCRIPTION OF EMBODIMENTS

Figure 1:
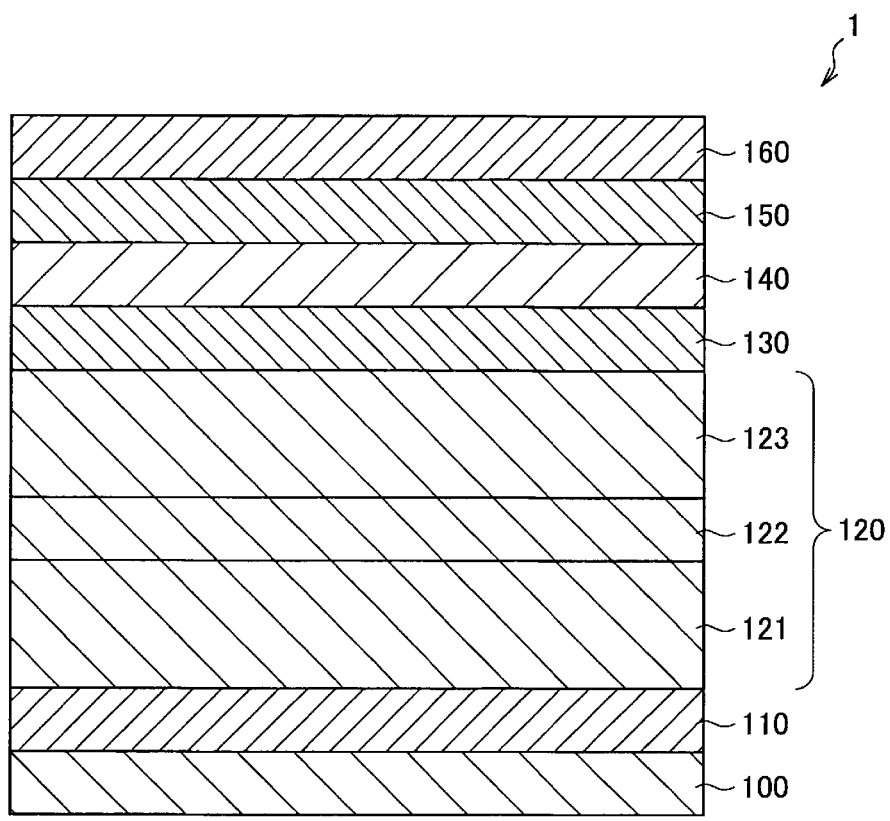
FIG. 1 is a schematic vertical cross-sectional view illustrating a laminated configuration of a magnetoresistance effect element according to a first embodiment of the present disclosure.

Preferred embodiments of the present disclosure will be described in detail with reference to the accompanying figures below. Also, in the present specification and the figures, components having substantially the same functional configuration will be denoted by the same reference numerals, and thus repeated descriptions thereof will be omitted.

In each figure referred to in the following description, sizes of some constituent members may be exaggerated for convenience of description. Therefore, relative sizes of constituent members shown in each figure do not necessarily accurately represent magnitude relationships between actual constituent members. Further, in the following description, a laminating direction of a substrate and layers is expressed as a vertical direction, and a direction in which the layers are laminated on the substrate or the like is expressed as an upward direction.

Also, the description will be given in the following order.
1. First embodiment
1.1. Configuration example
1.2. Example
2. Second embodiment
2.1. Configuration example
2.2. Example
3. Third embodiment
3.1. Configuration example
3.2. Example
4. Application example 1. First Embodiment (1.1. Configuration Example)

First, with reference to FIG. 1, a schematic configuration of a magnetoresistance effect element according to a first embodiment of the present disclosure will be described. FIG. 1 is a schematic vertical cross-sectional view illustrating a laminated configuration of a magnetoresistance effect element 1 according to the present embodiment.

As shown in FIG. 1, the magnetoresistance effect element 1 includes a substrate 100, a first electrode 110, a magnetization pinned layer 120, a first insulating layer 130, a magnetization free layer 140, a second insulating layer 150, and a second electrode 160. Further, the magnetization pinned layer 120 is configured of a non-magnetic metal layer 122 and a first magnetic body 121 and a second magnetic body 123 that sandwich the non-magnetic metal layer 122 in the laminating direction.

The magnetoresistance effect element 1 according to the present embodiment is, for example, a so-called spin transfer torque-magnetoresistive random access memory (STT-MRAM) in which a magnetization direction of the magnetization free layer 140 is controlled by a spin torque of electrons by passing a current between the first electrode 110 and the second electrode 160.

The substrate 100 is a member that supports each layer of the magnetoresistance effect element 1. The substrate 100 may be formed of any of a semiconductor, quartz, glass or an organic resin. For example, the substrate 100 may be formed of a semiconductor such as silicon (Si) or germanium (Ge), or a compound semiconductor such as gallium arsenide (GaAs), gallium nitride (GaN) or silicon carbide (SiC). Alternatively, the substrate 100 may be a silicon on insulator (SOI) substrate in which an insulating film such as $SiO_2$ is sandwiched in a silicon substrate.

The first electrode 110 is provided on the substrate 100 using various metal materials or alloy materials, and thus functions as a connection point between the magnetoresistance effect element 1 and various wirings. The first electrode 110 may be formed of a known material and a laminated structure, for example, may be formed of a single-layer film, or may be formed of a laminated film of a plurality of films.

The magnetization pinned layer 120 is provided on the first electrode 110 in a laminated ferrimagnetic structure in which, for example, the first magnetic body 121, the non-magnetic metal layer 122, and the second magnetic body 123 are laminated.

The first magnetic body 121 and the second magnetic body 123 are laminated structures each of which has an easy magnetization axis in a direction perpendicular to a film surface and includes at least one layer formed of a ferromagnetic material. The first magnetic body 121 and the second magnetic body 123 can fix magnetization directions due to magnetic coupling via the non-magnetic metal layer 122. As a result, when a current is passed between the first electrode 110 and the second electrode 160, the magnetoresistance effect element 1 can change only a magnetization direction of the magnetization free layer 140 without changing the magnetization directions of the first magnetic body 121 and the second magnetic body 123.

For example, in a case in which the magnetoresistance effect element 1 is used as an MRAM, the second magnetic body 123 functions as a reference layer that serves as a reference for the magnetization direction of the magnetization free layer 140, and the first magnetic body 121 functions as a pinned layer that fixes the magnetization direction of the second magnetic body 123 due to magnetic coupling.

In the technology according to the present disclosure, at least any of the first magnetic body 121 and the second magnetic body 123 is configured by providing a magnetic layer directly above a non-magnetic layer, and either the non-magnetic layer or the magnetic layer is configured to have a multi-layer structure in which different materials are alternately laminated. According to this, in the magnetoresistance effect element 1, the crystal orientation of the magnetic layer due to the non-magnetic layer can be improved and the perpendicular magnetic anisotropy of the magnetic layer can be enhanced. Therefore, in the magnetoresistance effect element 1, a magnetic coupling force between the first magnetic body 121 and the second magnetic body 123 can be increased. Further, since the magnetic characteristics of the magnetization pinned layer 120 are improved, the magnetoresistance effect element 1 can improve a magnetoresistance change rate (a magnetoresistance (MR) ratio) in the case in which it is used as an MRAM.

Figure 2:
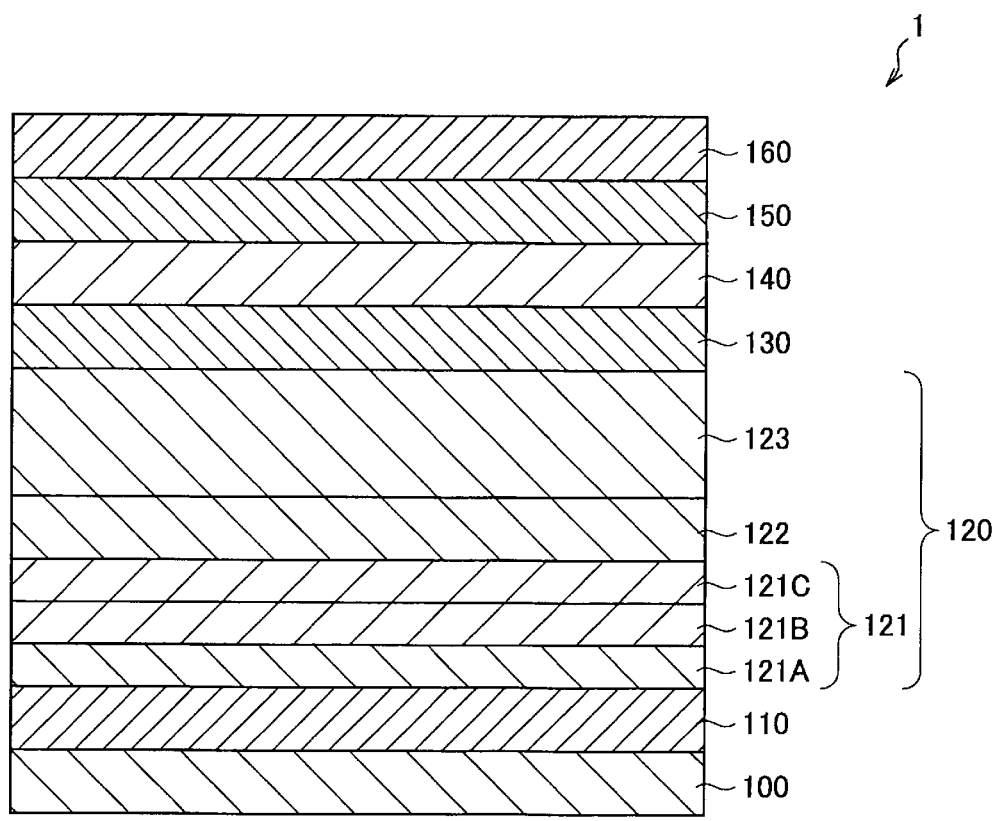
FIG. 2 is a schematic vertical cross-sectional view illustrating a specific configuration of the magnetoresistance effect element according to the same embodiment.

Here, in the magnetoresistance effect element 1 according to the first embodiment, the first magnetic body 121 is configured by providing the magnetic layer directly above the non-magnetic layer. A specific configuration of the first magnetic body 121 in the first embodiment will be described with reference to FIG. 2. FIG. 2 is a schematic vertical cross-sectional view illustrating a specific configuration of the magnetoresistance effect element 1 according to the first embodiment.

As shown in FIG. 2, in the first embodiment, the first magnetic body 121 is configured by providing a first magnetic layer 121B, in which different metal materials are alternately laminated, directly above a first non-magnetic layer 121A formed of a non-magnetic metal material. Further, a first magnetic metal layer 121C formed of a magnetic metal material may be further provided on the first magnetic layer 121B.

The first non-magnetic layer 121A is formed on the first electrode 110 using a non-magnetic metal material containing any one of molybdenum (Mo), tungsten (W), and iridium (Ir). Since the first non-magnetic layer 121A can eliminate mismatch in crystal orientation between the first electrode 110 and the first magnetic layer 121B, the crystal orientation and the perpendicular magnetic anisotropy of the first magnetic layer 121B can be enhanced. According to this, since the magnetic coupling force between the first magnetic body 121 and the second magnetic body 123 is increased, it is possible to further inhibit a change in the magnetization direction of the second magnetic body 123 (that is, erroneous writing). Therefore, the magnetoresistance effect element 1 can reduce an error rate in the case in which it is used as an MRAM.

The first magnetic layer 121B is formed directly above the first non-magnetic layer 121A by alternately laminating different types of metal materials. The first magnetic layer 121B may be formed, for example, by alternately laminating cobalt (Co) and platinum (Pt) a plurality of times. In a case in which the first magnetic layer 121B is formed as a laminated film of cobalt (Co) and platinum (Pt), the first magnetic layer 121B is formed to have a crystal orientation of the (111) plane of fcc. However, a crystal orientation of a metal material (for example, tantalum (Ta), ruthenium (Ru), or the like) constituting the first electrode 110 provided under the first magnetic body 121 may be different from the (111) plane of fcc. In the magnetoresistance effect element 1 according to the first embodiment, by providing the first non-magnetic layer 121A between the first electrode 110 and the first magnetic layer 121B, mismatch in the crystal orientation between these layers can be eliminated.

The first magnetic metal layer 121C can be formed on the first magnetic layer 121B using a magnetic metal material. The first magnetic metal layer 121C may be formed of, for example, a magnetic metal material containing cobalt (Co). The first magnetic metal layer 121C may be provided to control the magnetic characteristics of the first magnetic body 121 to be more suitable for the magnetoresistance effect element 1.

The non-magnetic metal layer 122 is provided on the first magnetic body 121 and between the first magnetic body 121 and the second magnetic body 123, thereby magnetically coupling the first magnetic body 121 and the second magnetic body 123. The non-magnetic metal layer 122 may be formed of a non-magnetic metal material such as iridium (Ir), molybdenum (Mo), tungsten (W), niobium (Nb), hafnium (Hf), or titanium (Ti) as a thin film layer having a film thickness of about 1 nm.

The second magnetic body 123 is provided on the non-magnetic metal layer 122 with a magnetic metal material. The second magnetic body 123 may be formed of, for example, a magnetic metal material containing cobalt (Co) or a magnetic material containing a 3d transition metal and boron (B). The second magnetic body 123 may be formed of a single-layer film or may be formed of a laminated film of a plurality of films. For example, the second magnetic body 123 may be formed by laminating Co, Mo, and CoFeB in order.

The first insulating layer 130 is provided on the magnetization pinned layer 120 with an insulating material. The first insulating layer 130 is provided between the magnetization pinned layer 120 and the magnetization free layer 140 to function as a tunnel insulating film of a magnetic tunnel junction (MTJ) element.

The first insulating layer 130 may be formed as a thin film layer having a film thickness of about 1 nm, for example, with an inorganic oxide such as magnesium oxide (MgO) or aluminum oxide ($Al_2O_3$). More specifically, the first insulating layer 130 may be formed of magnesium oxide (MgO)

with a film thickness of about 1 nm. In a case in which the first insulating layer 130 is formed of magnesium oxide (MgO), the first insulating layer 130 becomes a layer having good crystallinity at a lower temperature, and thus the tunnel magneto resistance effect (TMR effect) between the magnetization pinned layer 120 and the magnetization free layer 140 can be further enhanced.

The magnetization free layer 140 is provided on the first insulating layer 130 with a magnetic material. The magnetization free layer 140 is a magnetic layer which has an easy magnetization axis in a direction perpendicular to the film surface due to the interfacial perpendicular magnetic anisotropy generated at an interface with the first insulating layer 130, and of which the magnetization direction can be controlled. Specifically, the magnetization free layer 140 may be formed of a magnetic material containing a 3d transition metal and boron (B). More specifically, the magnetization free layer 140 may be formed of CoFeB with a film thickness of about 1 nm to 2 nm. According to this, the magnetization free layer 140 can further strengthen the perpendicular magnetic anisotropy. Further, the magnetization free layer 140 may be formed in a laminated structure with CoFeB and a non-magnetic metal material such as iridium (Ir), molybdenum (Mo), tungsten (W), niobium (Nb), hafnium (Hf) or titanium (Ti).

In the present embodiment, an MTJ element is configured by sandwiching the first insulating layer 130 between the magnetization pinned layer 120 and the magnetization free layer 140, which are ferromagnetic bodies. In the MTJ element, a voltage is applied perpendicularly to junction surfaces between the magnetization pinned layer 120, the magnetization free layer 140, and the first insulating layer 130, whereby a current flows through the first insulating layer 130 due to the TMR effect. A magnitude of the TMR effect at this time changes depending on whether the magnetization directions of the magnetization pinned layer 120 and the magnetization free layer 140 are parallel or antiparallel. Therefore, the magnetoresistance effect element 1 can control a resistance value between the first electrode 110 and the second electrode 160 by controlling the magnetization direction of the magnetization free layer 140.

The second insulating layer 150 is provided on the magnetization free layer 140 with an insulating material. The second insulating layer 150 may be formed as a thin film layer having a film thickness of about 1 nm with, for example, an inorganic oxide such as magnesium oxide (MgO) or aluminum oxide ($Al_2O_3$). More specifically, the second insulating layer 150 may be formed of magnesium oxide (MgO) with a film thickness of about 1 nm. Since the second insulating layer 150 can control the easy magnetization axis of the magnetization free layer 140 in the direction perpendicular to the film surface due to the interfacial perpendicular magnetic anisotropy, the perpendicular magnetic anisotropy of the magnetization free layer 140 can be further enhanced.

The second electrode 160 is provided on the second insulating layer 150 with various metal materials or alloy materials to function as a connection point between the magnetoresistance effect element 1 and various wirings. The second electrode 160 may be formed of a known material and a laminated structure, for example, may be formed of a single-layer film, or may be formed of a laminated film of a plurality of films.

Further, the magnetoresistance effect element 1 described above can be manufactured by using a known film forming means such as a sputtering method.

(1.2. Example)

Figure 3:
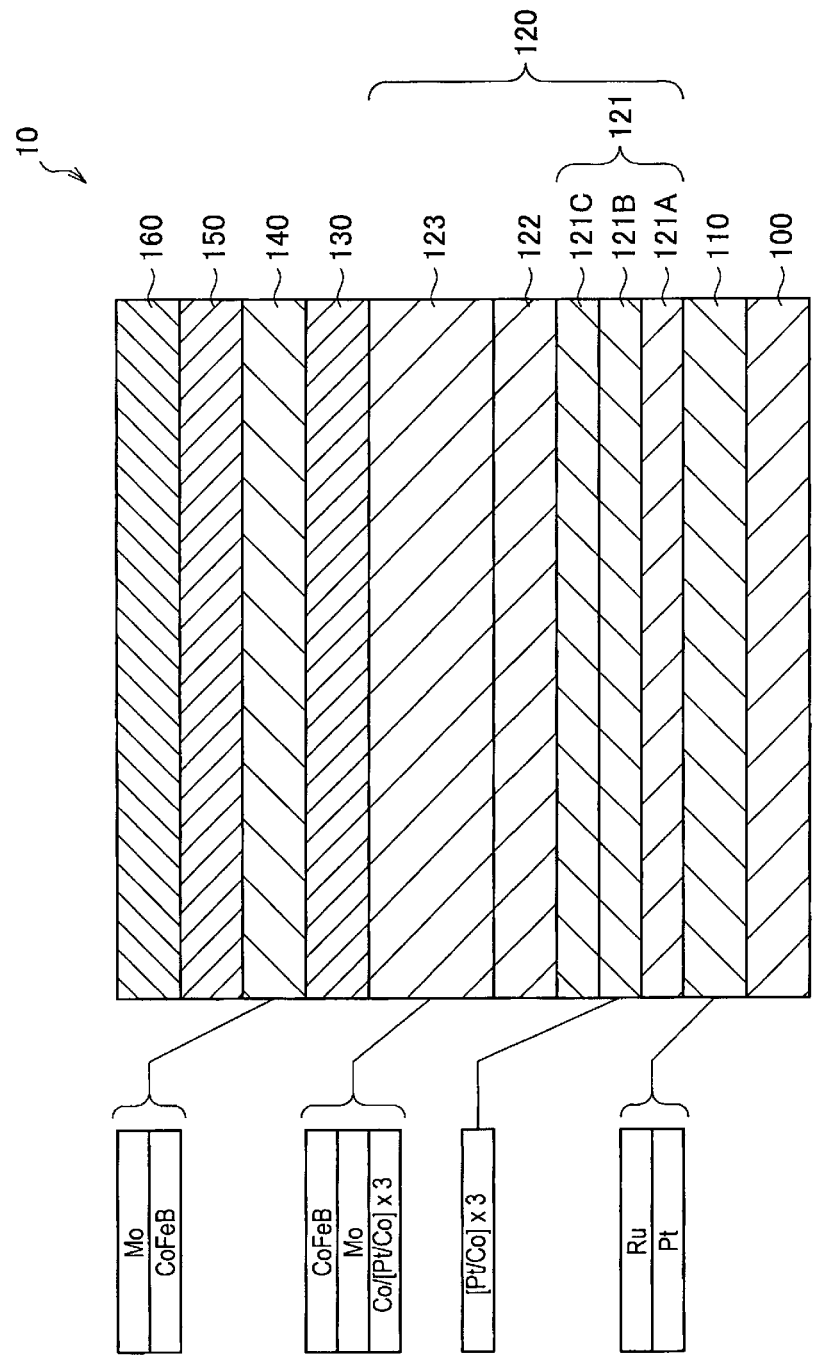
FIG. 3 is a schematic vertical cross-sectional view showing a laminated structure of a magnetoresistance effect element according to an example of the same embodiment.

Subsequently, an example of the magnetoresistance effect element 1 according to the first embodiment of the present disclosure will be described with reference to FIG. 3. FIG. 3 is a schematic vertical cross-sectional view showing a laminated structure of a magnetoresistance effect element 10 according to the example. In addition, in FIG. 3, the notation "A/B" indicates that a layer formed of A is provided on a layer formed of B.

As shown in FIG. 3, the magnetoresistance effect element 10 according to the example can be formed by laminating, on the substrate 100 formed of silicon (Si) or the like, the first electrode 110 in which Pt and Ru are laminated in order from the substrate 100 side, the first non-magnetic layer 121A formed of Mo, the first magnetic layer 121B in which Co and Pt are repeatedly laminated three times, the first magnetic metal layer 121C formed of Co, the non-magnetic metal layer 122 formed of Ir, the second magnetic body 123 in which Co and Pt are repeatedly laminated three times and then Co, Mo, and CoFeB are laminated in order, the first insulating layer 130 formed of MgO, the magnetization free layer 140 in which CoFeB and Mo are laminated in order, the second insulating layer 150 formed of MgO, and the second electrode 160 formed of Ta or Ru in order.

In the magnetoresistance effect element 10 according to the example, the first non-magnetic layer 121A can be formed of any of Mo, W, and Ir. Here, FIGS. 4A to 4C show examples of changes in exchange coupling magnetic field Hex of the first magnetic body 121 and the second magnetic body 123 in a case in which a film thickness of the first non-magnetic layer 121A formed of each of Mo, W, and Ir is changed.

Figure 4A:
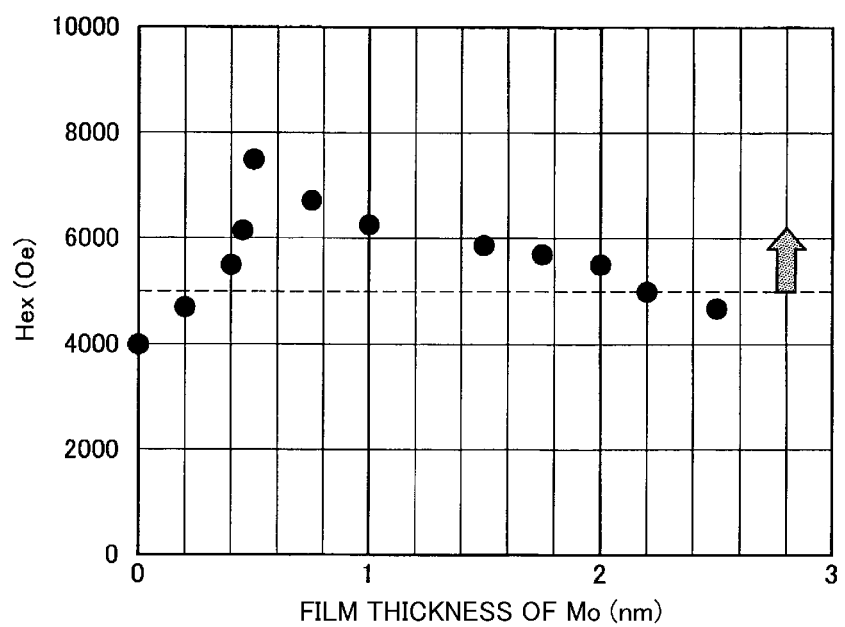
FIG. 4A is a graph showing an example of change in exchange coupling magnetic field Hex when a film thickness of a first non-magnetic layer formed of Mo is changed in the magnetoresistance effect element according to the same example.
Figure 4B:
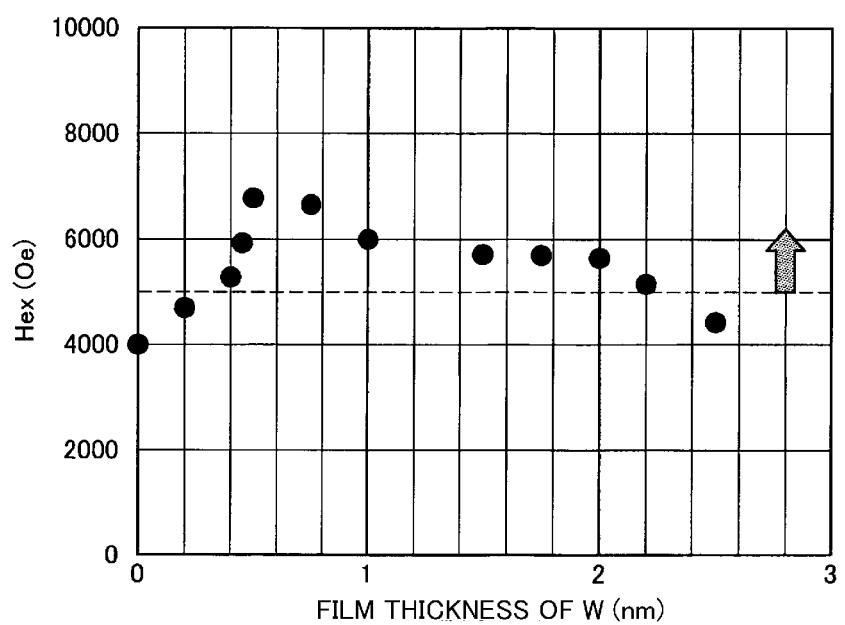
FIG. 4B is a graph showing an example of change in exchange coupling magnetic field Hex when a film thickness of a first non-magnetic layer formed of W is changed in the magnetoresistance effect element according to the same example.
Figure 4C:
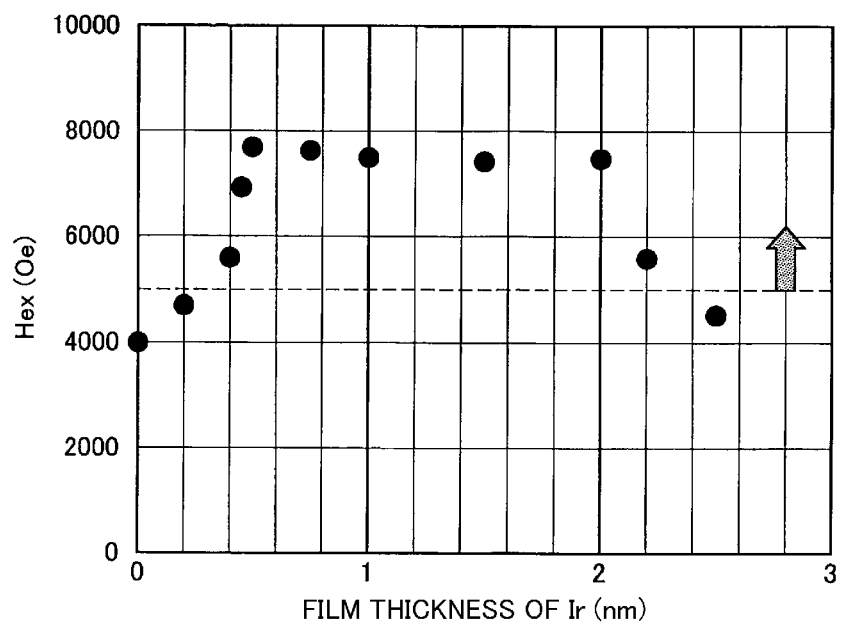
FIG. 4C is a graph showing an example of change in exchange coupling magnetic field Hex when a film thickness of a first non-magnetic layer formed of Ir is changed in the magnetoresistance effect element according to the same example.

FIG. 4A is a graph showing an example of change in exchange coupling magnetic field Hex in a case in which the film thickness of the first non-magnetic layer 121A formed of Mo is changed, FIG. 4B is a graph showing an example of change in exchange coupling magnetic field Hex in a case in which the film thickness of the first non-magnetic layer 121A formed of W is changed, and FIG. 4C is a graph showing an example of change in exchange coupling magnetic field Hex in a case in which the film thickness of the first non-magnetic layer 121A formed of Ir is changed. In the graphs shown in FIGS. 4A to 4C, the film thickness of the first non-magnetic layer 121A is taken on a horizontal axis, and the exchange coupling magnetic field between the first magnetic body 121 and the second magnetic body 123 is taken on a vertical axis.

Referring to FIGS. 4A to 4C, it can be seen that the exchange coupling magnetic field is 5000 Oe (397885 A/m) or more within a range in which the film thickness of the first non-magnetic layer 121A is 0.4 nm or more and 2.2 nm or less even in the case in which the first non-magnetic layer 121A is formed of any of Mo, W, and Ir. Therefore, it can be seen that the magnetoresistance effect element 10 can realize a good magnetic coupling force in the case in which the film thickness of the first non-magnetic layer 121A is within the above range.

Also, it can be seen that the exchange coupling magnetic field becomes even higher within a range in which the film thickness of the first non-magnetic layer 121A is 0.6 nm or more and 2.0 nm or less even in the case in which the first non-magnetic layer 121A is formed of any of Mo, W, and Ir. Therefore, it can be seen that the magnetoresistance effect element 10 can realize a better magnetic coupling force within such a range of the film thickness of the first non-magnetic layer 121A.

Further, referring to FIGS. 4A to 4C, it can be seen that the magnetoresistance effect element 10 can realize a higher exchange-coupled magnetic field in the case in which the first non-magnetic layer 121A is formed of Ir than a case in which the first non-magnetic layer 121A is formed of Mo or W. Therefore, it can be seen that the magnetoresistance effect element 10 can realize a better magnetic coupling force in the case in which the first non-magnetic layer 121A is formed of Ir.

2. Second Embodiment (2.1. Configuration Example)

Figure 5:
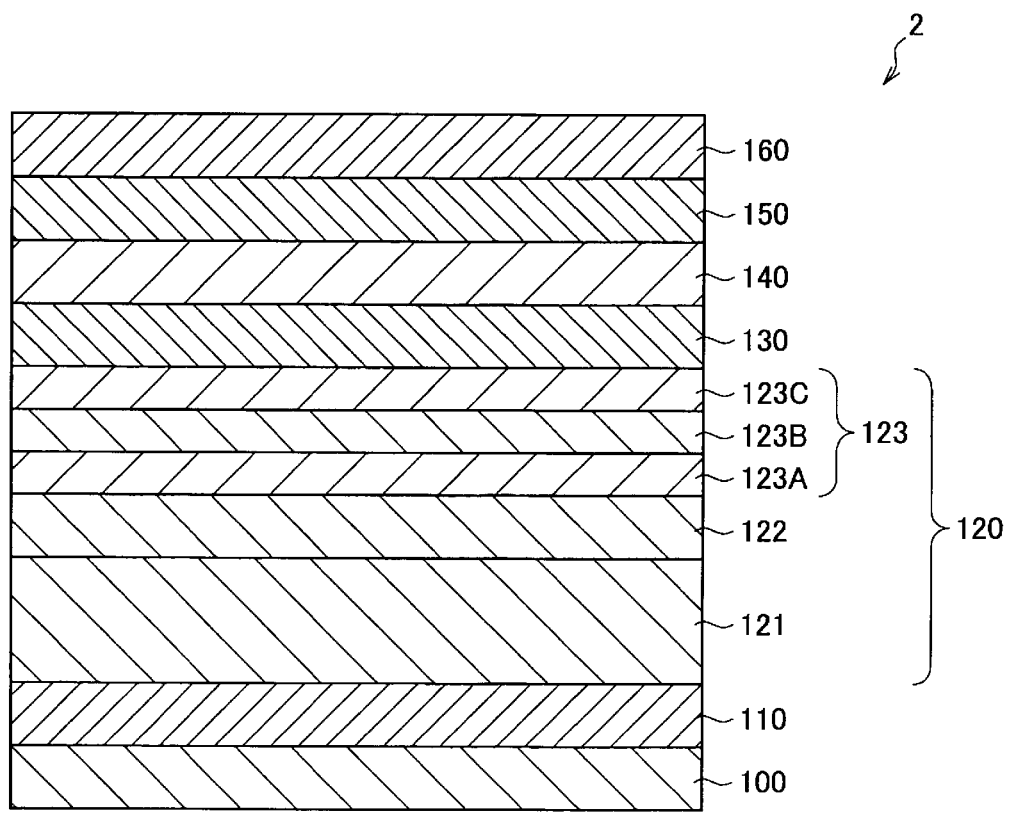
FIG. 5 is a schematic vertical cross-sectional view illustrating a specific configuration of a magnetoresistance effect element according to a second embodiment of the present disclosure.

Next, with reference to FIG. 5, a specific configuration of a magnetoresistance effect element according to a second embodiment of the present disclosure will be described. FIG. 5 is a schematic vertical cross-sectional view illustrating a specific configuration of a magnetoresistance effect element 2 according to the present embodiment.

As shown in FIG. 5, the magnetoresistance effect element 2 includes the substrate 100, the first electrode 110, the magnetization pinned layer 120, the first insulating layer 130, the magnetization free layer 140, the second insulating layer 150, and the second electrode 160. Further, the magnetization pinned layer 120 is configured of the non-magnetic metal layer 122, and the first magnetic body 121 and the second magnetic body 123 that sandwich the non-magnetic metal layer 122 in the laminating direction.

Also, configurations other than the first magnetic body 121 and the second magnetic body 123 are substantially the same in the magnetoresistance effect element 1 according to the first embodiment and the magnetoresistance effect element 2 according to the second embodiment, and thus descriptions thereof will be omitted here.

The first magnetic body 121 is provided on the first electrode 110 with a magnetic metal material. The first magnetic body 121 may be formed of, for example, a magnetic metal material containing cobalt (Co) or a magnetic material containing a 3d transition metal and boron (B). The first magnetic body 121 may be formed of a single-layer film or may be formed of a laminated film of a plurality of films. For example, the first magnetic body 121 may be formed by repeatedly laminating Co and Pt three times and then laminating Co.

In the magnetoresistance effect element 2 according to the second embodiment, the second magnetic body 123 is configured by providing a magnetic layer directly above a non-magnetic layer. Specifically, as shown in FIG. 5, the second magnetic body 123 is configured by providing a second magnetic layer 123C formed of a magnetic material containing a 3d transition metal and boron (B) directly above a second non-magnetic layer 123B in which a magnetic material containing a 3d transition metal and boron (B) and a non-magnetic metal material are alternately laminated. Further, a second magnetic metal layer 123A formed of a magnetic metal material may be further provided under the second non-magnetic layer 123B.

The second magnetic metal layer 123A can be formed on the non-magnetic metal layer 122 using a magnetic metal material. For example, the second magnetic metal layer 123A may be formed of a magnetic metal material containing cobalt (Co). The second magnetic metal layer 123A may be provided to control the magnetic characteristics of the first magnetic body 121 to be more suitable for the magnetoresistance effect element 2.

The second non-magnetic layer 123B is formed on the second magnetic metal layer 123A by alternately laminating a magnetic material containing a 3d transition metal and boron (B) and a non-magnetic metal material. The second non-magnetic layer 123B may be formed, for example, by alternately laminating a magnetic material containing CoFeB and a non-magnetic metal material containing any of molybdenum (Mo), tungsten (W), and iridium (Ir) a plurality of times.

The second non-magnetic layer 123B is a layer that is amorphous and non-magnetic as a whole, although it contains a layer formed of a magnetic material in a laminated structure. The second non-magnetic layer 123B can improve a crystal orientation of the second magnetic layer 123C by including a layer formed of a magnetic material common to the second magnetic layer 123C in the laminated structure. According to this, since the second non-magnetic layer 123B can increase the perpendicular magnetic anisotropy of the second magnetic layer 123C, an MR ratio of the magnetoresistance effect element 2 can be further increased.

Here, the second non-magnetic layer 123B may be provided in a laminated structure in which at least one of the uppermost layer and the lowermost layer is a layer formed of a non-magnetic metal material. Since the second non-magnetic layer 123B is provided on the second magnetic metal layer 123A and below the second magnetic layer 123C, both sides thereof in the laminating direction are sandwiched between the layers formed of a magnetic material. For that reason, in the second non-magnetic layer 123B, at least one of the uppermost layer and the lowest layer of the laminated structure is formed as a layer formed of a non-magnetic metal material, whereby a repeated structure of the magnetic layer and the non-magnetic layer (that is, a laminated ferrimagnetic structure) can be formed between the second magnetic metal layer 123A and the second magnetic layer 123C. According to this, the second non-magnetic layer 123B can further increase the MR ratio of the magnetoresistance effect element 2. Further, in the second non-magnetic layer 123B, both the uppermost layer and the lowermost layer of the laminated structure may be formed of a non-magnetic metal material.

The second magnetic layer 123C is formed of a magnetic material containing a 3d transition metal and boron (B) and is formed directly above the second non-magnetic layer 123B. For example, the second magnetic layer 123C may be formed of CoFeB with a film thickness of about 1 nm to 2 nm. Since the crystal orientation of the second magnetic layer 123C can be improved by the second non-magnetic layer 123B directly below the second magnetic layer 123C, the MR ratio of the magnetoresistance effect element 2 can be further increased.

Also, the magnetoresistance effect element 2 described above can be manufactured by using a known film forming means such as a sputtering method.

(2.2. Example)

Figure 6:
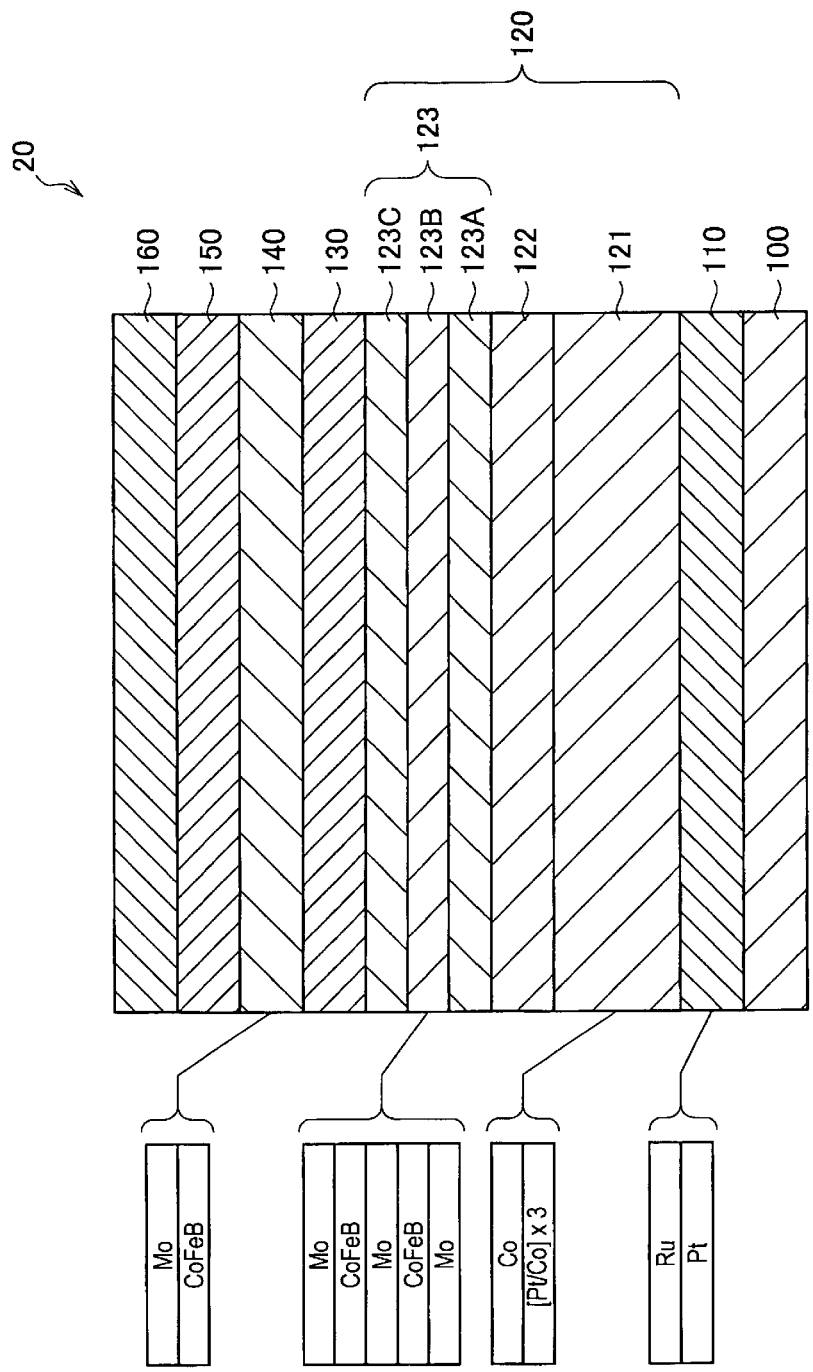
FIG. 6 is a schematic vertical cross-sectional view showing a laminated structure of a magnetoresistance effect element according to an example of the same embodiment.

Subsequently, with reference to FIG. 6, an example of the magnetoresistance effect element 2 according to the second embodiment of the present disclosure will be described. FIG. 6 is a schematic vertical cross-sectional view showing a laminated structure of a magnetoresistance effect element 20 according to the example. In addition, in FIG. 6, the notation "A/B" indicates that a layer formed of A is provided on a layer formed of B.

As shown in FIG. 6, the magnetoresistance effect element 20 according to the example can be formed by laminating, on the substrate 100 formed of silicon (Si) or the like, the first electrode 110 in which Pt and Ru are laminated in order from the substrate 100 side, the first magnetic body 121 in which Co and Pt are repeatedly laminated three times and then Co is laminated, the non-magnetic metal layer 122 formed of Ir, the second magnetic metal layer 123A in which Co and Pt are repeatedly laminated three times and then Co is laminated, the second non-magnetic layer 123B in which Mo and CoFeB are alternately laminated, the second magnetic layer 123C formed of CoFeB, the first insulating layer 130 formed of MgO, the magnetization free layer 140 in which CoFeB and Mo are laminated in order, the second insulating layer 150 formed of MgO, and the second electrode 160 formed of Ta or Ru in order.

In the magnetoresistance effect element 20 according to the example, the second non-magnetic layer 123B can be formed in a laminated structure of a magnetic material containing CoFeB and a non-magnetic metal material containing any of Mo, W, and Ir. Here, FIG. 7A shows an example of change in exchange coupling magnetic field Hex and MR ratio of the first magnetic body 121 and the second magnetic body 123 in a case in which a film thickness of a layer formed of a non-magnetic metal material containing CoFeB is changed.

Figure 7A:
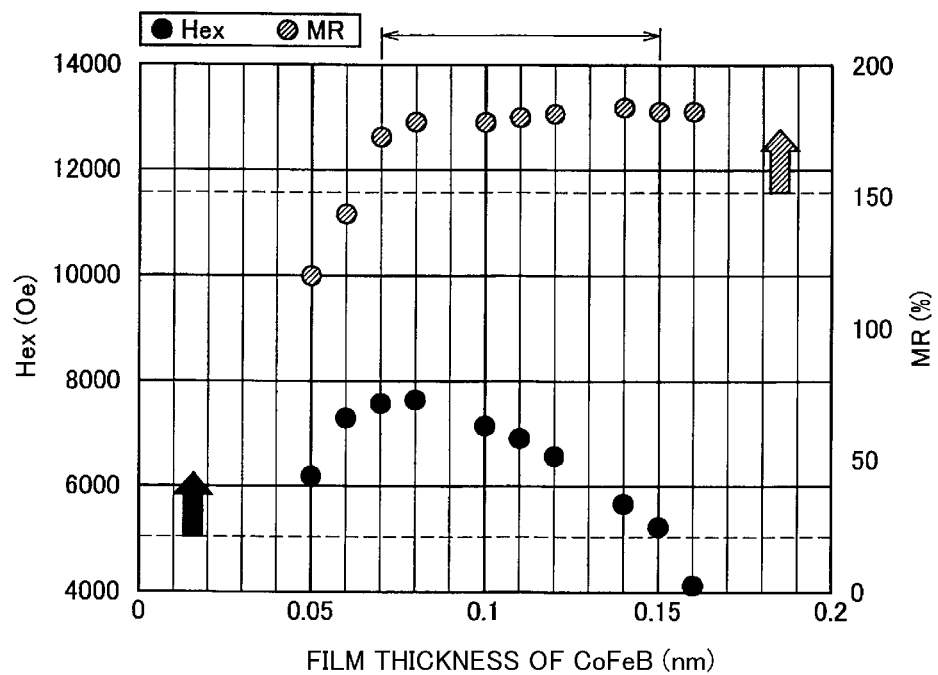
FIG. 7A is a graph showing an example of change in exchange coupling magnetic field Hex and MR ratio in a case in which proportions of a film thickness of CoFeB and a film thickness of Mo are set to 1:1 and a film thickness of a layer formed by CoFeB is changed in a second non-magnetic layer of the magnetoresistance effect element according to the same example.

FIG. 7A is a graph showing an example of change in exchange coupling magnetic field Hex and MR ratio in a case in which proportions of a film thickness of CoFeB and a film thickness of Mo are set to 1:1 and the film thickness of the layer formed of CoFeB is changed in the second non-magnetic layer 123B.

Referring to FIG. 7A, it can be seen that, in a case in which the film thickness of the layer formed of CoFeB is too thin, the MR ratio decreases, and in a case in which the film thickness of the layer formed of CoFeB is too thick, the exchange coupling magnetic field Hex decreases. Specifically, it can be seen that, in a case in which the film thickness of the layer formed of CoFeB is 0.07 nm or more and 0.15 nm or less, the exchange coupling magnetic field Hex is 5000 Oe (397885 A/m) or more, and the MR ratio is 150% or more. Therefore, it can be seen that the magnetoresistance effect element 20 can realize good characteristics in the case in which the film thickness of the layer formed of CoFeB is within the above range.

Figure 7B:
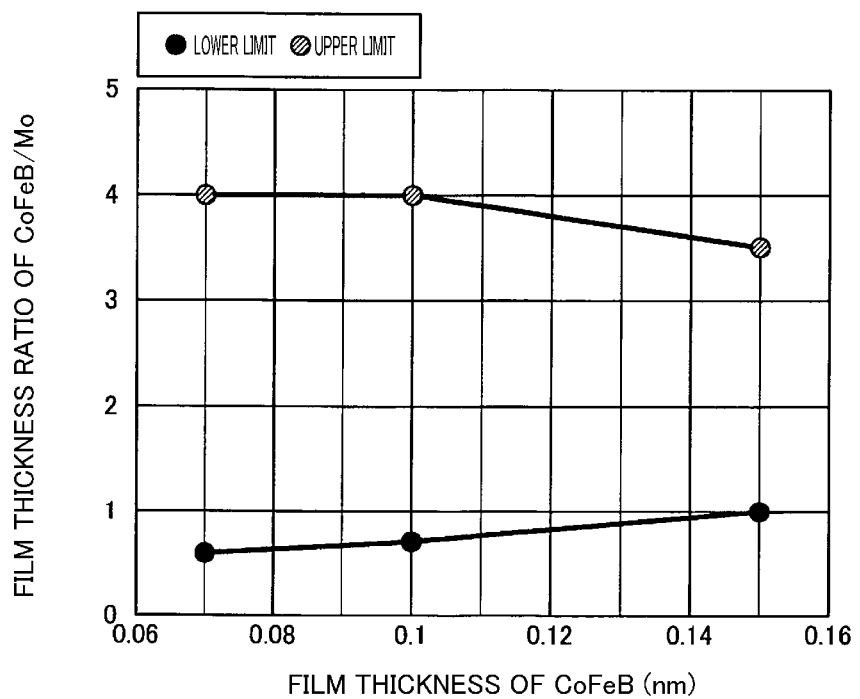
FIG. 7B is a graph in which the proportions of the film thicknesses of Mo and CoFeB that realize good exchange coupling magnetic field Hex and the MR ratio shown in FIG. 7A are plotted for each film thickness of CoFeB.
Figure 7C:
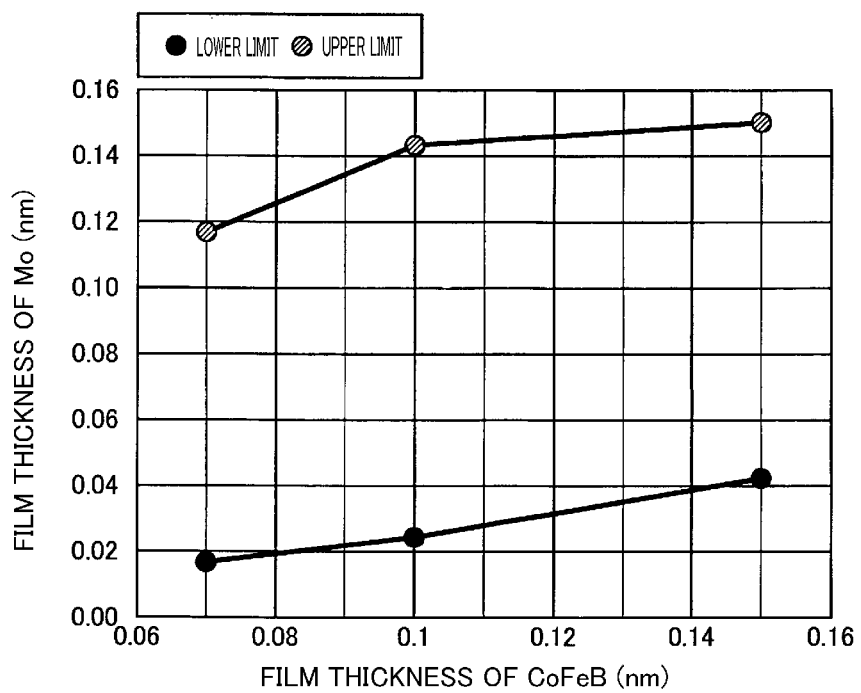
FIG. 7C is a graph in which film thicknesses of Mo realizing good exchange coupling magnetic field and the MR ratio shown in FIG. 7A by converting the results of FIG. 7B are plotted for each film thickness of CoFeB.

Further, from the results shown in FIG. 7A, an appropriate range between the film thickness of the layer formed of Mo and the film thickness of the layer formed of CoFeB is calculated. The results are shown in FIGS. 7B and 7C. FIG. 7B is a graph in which film thickness ratios of Mo to CoFeB that realize the above-mentioned good exchange coupling magnetic field Hex and MR ratio are plotted for each film thickness of CoFeB. Further, FIG. 7C is a graph obtained by converting the results of FIG. 7B and plotting film thicknesses of Mo realizing the above-mentioned good exchange coupling magnetic field and the MR ratio for each film thickness of CoFeB.

In FIGS. 7B and 7C, the range surrounded by the upper limit and the lower limit shows a combination of the film thicknesses of Mo and CoFeB that realizes the above-mentioned good exchange coupling magnetic field Hex and MR ratio. Further, FIG. 7D shows results of converting the combination of the film thicknesses of Mo and CoFeB plotted in FIG. 7C into at % in the entire second non-magnetic layer 123B in a case in which the second non-magnetic layer 123B has a laminated structure of Mo, CoFeB, Mo, CoFeB, and Mo.

Figure 7D:
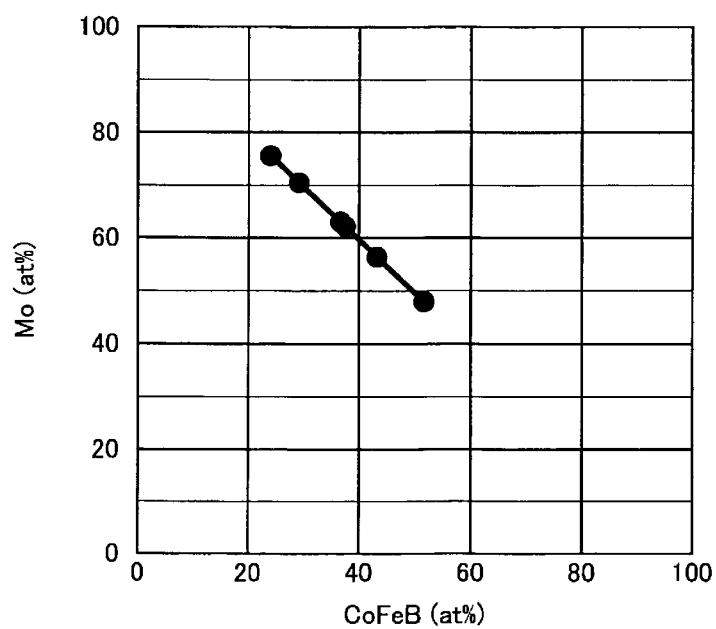
FIG. 7D is a graph showing results of converting the combination of the film thicknesses of Mo and CoFeB plotted in FIG. 7C into at % in the entire second non-magnetic layer.

According to FIG. 7D, it can be seen that atomic proportions of CoFeB (magnetic material) and Mo (non-magnetic metal material) of the entire second non-magnetic layer 123B are in the range of CoFeB:Mo=24.1 at %:75.9 at % to 51.7 at %:48.3 at %, the magnetoresistance effect element 20 can realize the above-mentioned good exchange coupling magnetic field Hex and MR ratio.

3. Third Embodiment (3.1. Configuration Example)

Figure 8:
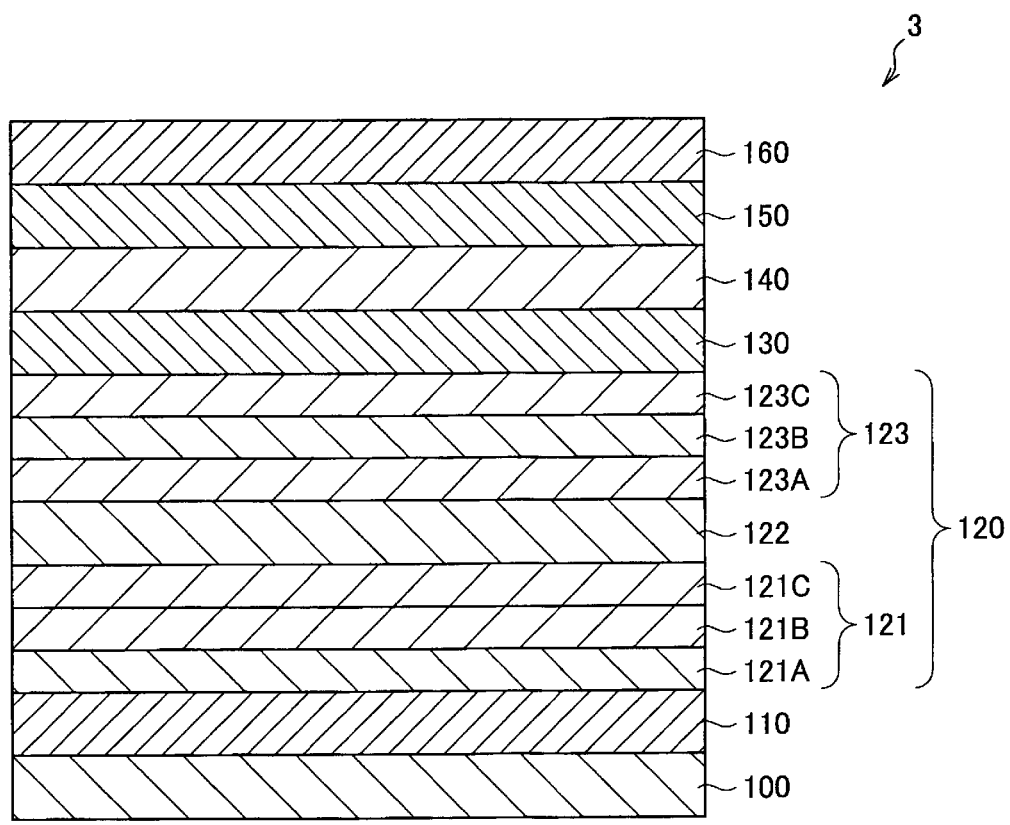
FIG. 8 is a schematic vertical cross-sectional view illustrating a specific configuration of a magnetoresistance effect element according to a third embodiment of the present disclosure.

Next, with reference to FIG. 8, a specific configuration of a magnetoresistance effect element according to a third embodiment of the present disclosure will be described. FIG. 8 is a schematic vertical cross-sectional view illustrating a specific configuration of a magnetoresistance effect element 3 according to the present embodiment. In addition, in FIG. 8, the notation "A/B" indicates that a layer formed of A is provided on a layer formed of B.

As shown in FIG. 8, the magnetoresistance effect element 3 includes the substrate 100, the first electrode 110, the magnetization pinned layer 120, the first insulating layer 130, the magnetization free layer 140, the second insulating layer 150, and the second electrode 160. Further, the magnetization pinned layer 120 is configured of the non-magnetic metal layer 122, and the first magnetic body 121 and the second magnetic body 123 that sandwich the non-magnetic metal layer 122 in the laminating direction.

In the magnetoresistance effect element 3 according to the third embodiment, the first magnetic body 121 is configured by providing a magnetic layer directly above a non-magnetic layer, and the second magnetic body 123 is configured by providing a magnetic layer directly above a non-magnetic layer. That is, the magnetoresistance effect element 3 according to the third embodiment corresponds to a combination of the magnetoresistance effect element 1 according to the first embodiment and the magnetoresistance effect element 2 according to the second embodiment.

Also, since configurations other than the first magnetic body 121 and the second magnetic body 123 are substantially the same as those of the magnetoresistance effect element according to the first or second embodiment and the magnetoresistance effect element 3 according to the third embodiment, descriptions thereof will be omitted here.

Specifically, as shown in FIG. 8, the first magnetic body 121 is configured by providing the first magnetic layer 121B in which different metal materials are alternately laminated directly above the first non-magnetic layer 121A formed of a non-magnetic metal material. Further, the second magnetic body 123 is configured by providing the second magnetic layer 123C formed of a magnetic material containing a 3d transition metal and boron (B) directly above the second non-magnetic layer 123B in which a magnetic material containing a 3d transition metal and boron (B) and a non-magnetic metal material are alternately laminated. Also, the first magnetic metal layer 121C and the second magnetic metal layer 123A formed of magnetic metal materials may be further provided on the first magnetic layer 121B and below the second non-magnetic layer 123B, respectively.

For example, the first non-magnetic layer 121A is formed on the first electrode 110 using a non-magnetic metal material containing any of molybdenum (Mo), tungsten (W), and iridium (Ir). Since the first non-magnetic layer 121A can eliminate mismatch in crystal orientation between the first electrode 110 and the first magnetic layer 121B, the crystal orientation and the perpendicular magnetic anisotropy of the first magnetic layer 121B can be enhanced.

The first magnetic layer 121B is formed directly above the first non-magnetic layer 121A by alternately laminating different types of metal materials. The first magnetic layer 121B may be formed, for example, by alternately laminating cobalt (Co) and platinum (Pt) a plurality of times.

The first magnetic metal layer 121C can be formed on the first magnetic layer 121B using a magnetic metal material. The first magnetic metal layer 121C may be formed of, for example, a magnetic metal material containing cobalt (Co).

The second magnetic metal layer 123A can be formed on the non-magnetic metal layer 122 with a magnetic metal material. For example, the second magnetic metal layer 123A may be formed of a magnetic metal material containing cobalt (Co).

The second non-magnetic layer 123B is formed on the second magnetic metal layer 123A by alternately laminating a magnetic material containing a 3d transition metal and boron (B) and a non-magnetic metal material. The second non-magnetic layer 123B may be formed, for example, by alternately laminating a magnetic material containing CoFeB and a non-magnetic metal material containing any of molybdenum (Mo), tungsten (W), and iridium (Ir) a plurality of times. The second non-magnetic layer 123B is a layer that is amorphous and non-magnetic as a whole, although it contains a layer formed of a magnetic material in the laminated structure. The second non-magnetic layer 123B can improve the crystal orientation of the second magnetic layer 123C by including a layer formed of a magnetic material common to the second magnetic layer 123C in the laminated structure.

The second magnetic layer 123C is formed of a magnetic material containing a 3d transition metal and boron (B) and is formed directly above the second non-magnetic layer 123B. For example, the second magnetic layer 123C may be formed by CoFeB with a film thickness of about 1 nm to 2 nm. Since the crystal orientation of the second magnetic layer 123C can be improved by the second non-magnetic layer 123B directly below the second magnetic layer 123C, the MR ratio of the magnetoresistance effect element 2 can be further increased.

According to the third embodiment, it is possible to further improve the exchange coupling magnetic field Hex of the first magnetic body 121 and the second magnetic body 123 and the MR ratio of the magnetoresistance effect element 3 with respect to the magnetoresistance effect elements 1 and 2 according to the first and second embodiments.

Also, the magnetoresistance effect element 3 described above can be manufactured by using a known film forming means such as a sputtering method.

(3.2. Example)

Figure 9:
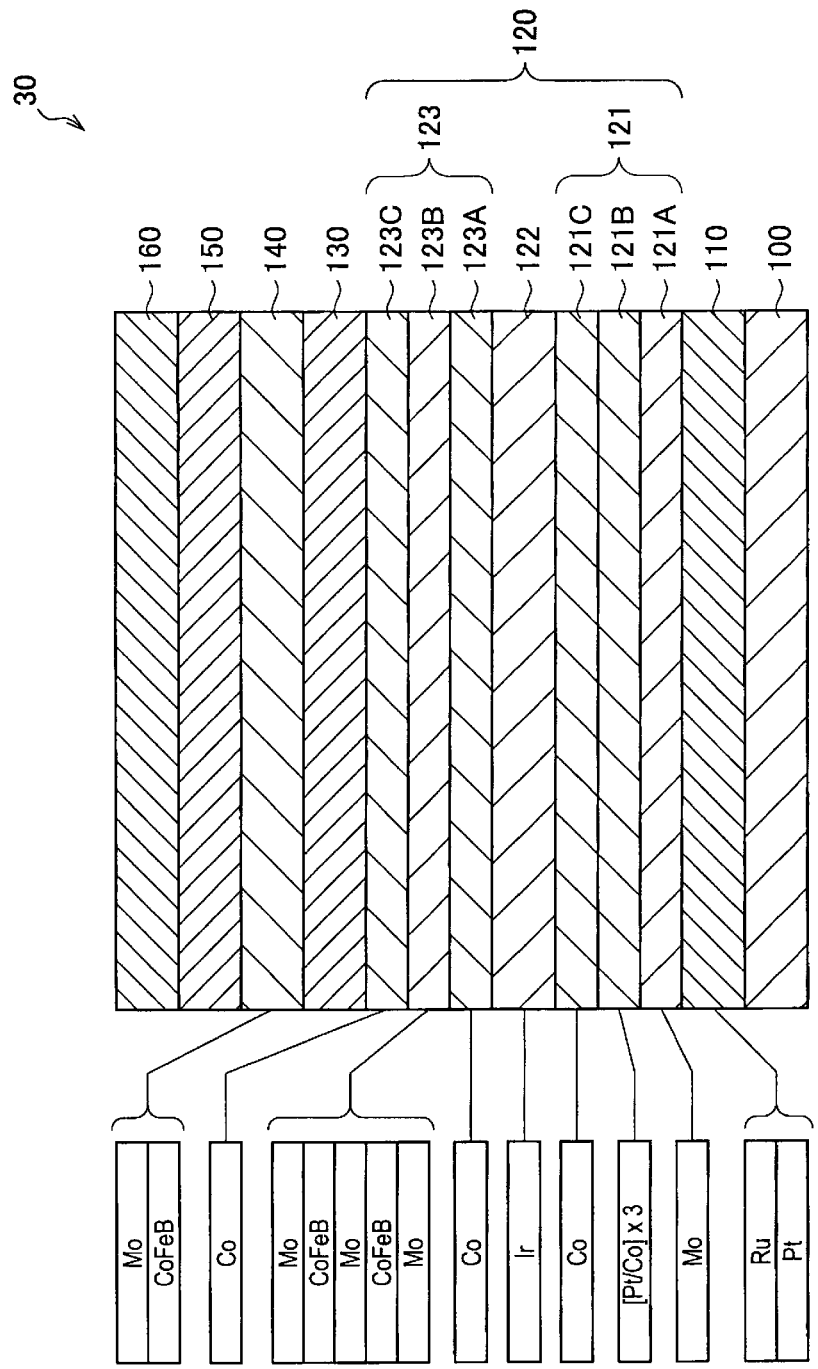
FIG. 9 is a schematic vertical cross-sectional view showing a laminated structure of the magnetoresistance effect element according to an example of the same embodiment.

Subsequently, an example of the magnetoresistance effect element 3 according to the third embodiment of the present disclosure will be described with reference to FIG. 9. FIG. 9 is a schematic vertical cross-sectional view showing a laminated structure of a magnetoresistance effect element 30 according to the example. In addition, in FIG. 9, the notation "A/B" indicates that a layer formed of A is provided on a layer formed of B.

As shown in FIG. 9, the magnetoresistance effect element 30 according to the example can be formed by laminating, on the substrate 100 formed of silicon (Si) or the like, the first electrode 110 in which Pt and Ru are laminated in order from the substrate 100 side, the first non-magnetic layer 121A formed of Mo, the first magnetic layer 121B in which Co and Pt are repeatedly laminated three times, the first magnetic metal layer 121C formed of Co, the non-magnetic metal layer 122 formed of Ir, the second magnetic metal layer 123A formed of Co, the second non-magnetic layer 123B in which Mo and CoFeB are alternately laminated, the second magnetic layer 123C formed of Co, the first insulating layer 130 formed of MgO, the magnetization free layer 140 in which CoFeB and Mo are laminated in order, the second insulating layer 150 formed of MgO, and the second electrode 160 formed of Ta or Ru in order. The magnetoresistance effect element 3 according to the third embodiment of the present disclosure may be formed in such a laminated structure.

4. Application Example

Figure 10A:
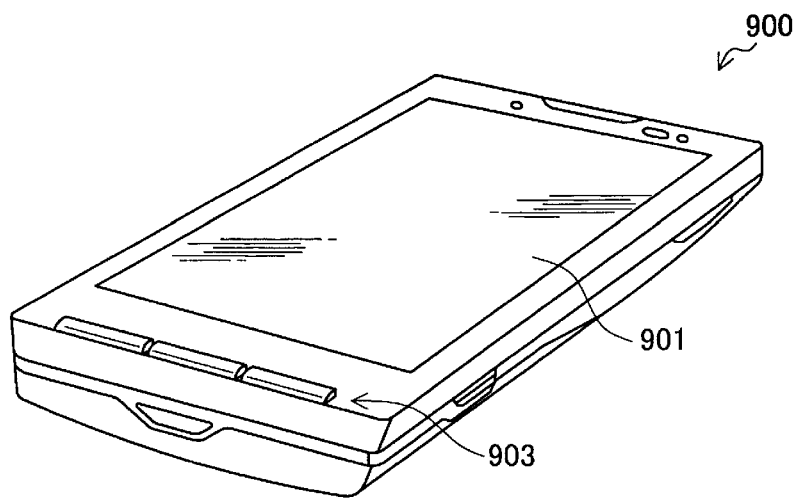
FIG. 10A is an external view showing an example of an electronic device according to an embodiment of the present disclosure.
Figure 10B:
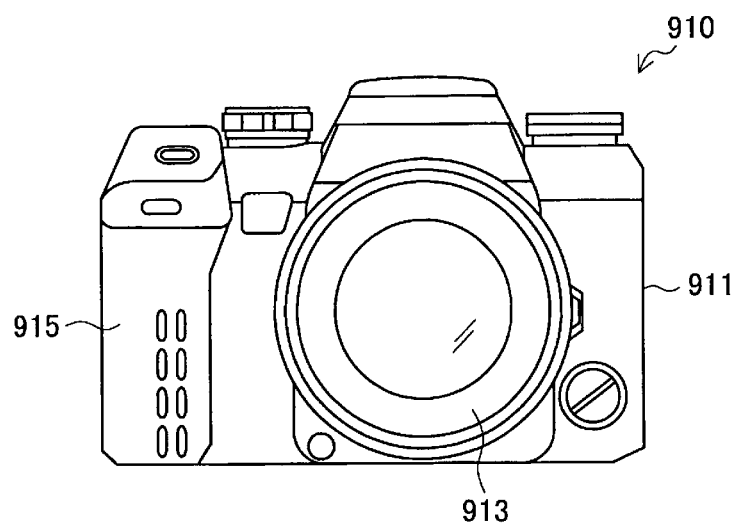
FIG. 10B is an external view of another example of the electronic device according to the embodiment of the present disclosure from the front.
Figure 10C:
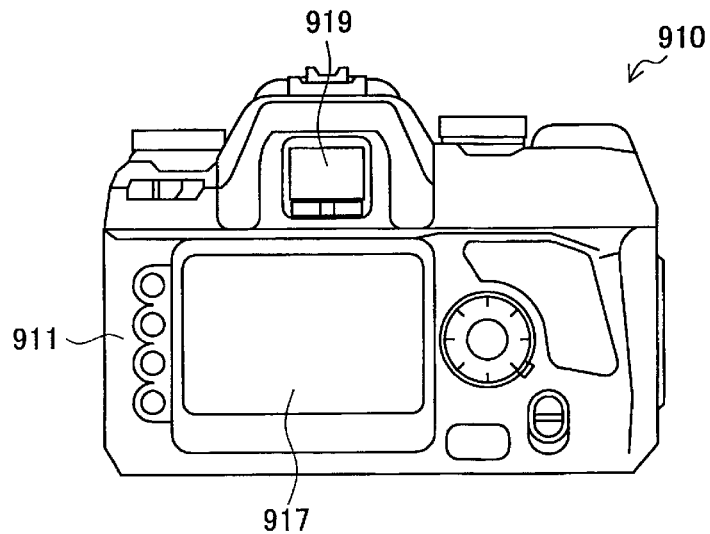
FIG. 10C is an external view of another example of the electronic device according to the embodiment of the present disclosure from the rear.

Subsequently, an electronic device according to an embodiment of the present disclosure will be described. The electronic device according to the embodiment of the present disclosure is various electronic devices on which a circuit including the above-mentioned magnetoresistance effect element is mounted. An example of such an electronic device according to the present embodiment will be described with reference to FIGS. 10A to 10C. FIGS. 10A to 10C are external views showing an example of the electronic device according to the present embodiment.

For example, the electronic device according to the present embodiment may be an electronic device such as a smartphone. Specifically, as shown in FIG. 10A, a smartphone 900 includes a display unit 901 that displays various information, and an operation unit 903 that includes buttons and the like that accept an operation input performed by a user. Here, a circuit mounted on the smartphone 900 may be provided with the above-mentioned magnetoresistance effect element as, for example, an MRAM.

For example, the electronic device according to the present embodiment may be an electronic device such as a digital camera. Specifically, as shown in FIGS. 10B and 10C, a digital camera 910 includes a main body (camera body) 911, an interchangeable lens unit 913, a grip part 915 gripped by a user at the time of photographing, a monitor unit 917 that displays various information, and an electronic view finder (EVF) 919 that displays a through image observed by the user during photographing. Further, FIG. 10B is an external view of the digital camera 910 from the front (that is, a subject side), and FIG. 10C is an external view of the digital camera 910 from the rear (that is, a photographer side). Here, a circuit mounted on the digital camera 910 may be provided with the above-mentioned magnetoresistance effect element as, for example, an MRAM.

However, the electronic device according to the present embodiment is not limited to the above example. The electronic device according to the present embodiment may be an electronic device in any field. As such an electronic device, for example, eyeglass-type wearable devices, head mounted displays (HMDs), television devices, electronic books, personal digital assistants (PDAs), notebook personal computers, video cameras, game devices, and the like can be exemplified.

Although the preferred embodiments of the present disclosure have been described in detail with reference to the accompanying figures as described above, the technical scope of the present disclosure is not limited to such examples. It is apparent that those having ordinary knowledge in the technical field of the present disclosure could conceive various modified examples or changed examples within the scope of the technical ideas set forth in the claims, and it should be understood that these also naturally fall within the technical scope of the present disclosure.

Further, the effects described in the present specification are merely explanatory or exemplary and are not intended as limiting. That is, the techniques according to the present disclosure may exhibit other effects apparent to those skilled in the art from the description herein, in addition to or in place of the above effects.

Further, the following configurations also fall within the technical scope of the present disclosure.

(1)

A magnetoresistance effect element including: a first electrode;
- a magnetization pinned layer that is provided on the first electrode and has a fixed magnetization direction;
- a first insulating layer provided on the magnetization pinned layer;
- a magnetization free layer that is provided on the first insulating layer and has a variable magnetization direction;
- a second insulating layer provided on the magnetization free layer; and
- a second electrode provided on the second insulating layer,
- wherein
- the magnetization pinned layer includes a first magnetic body provided on the first electrode, and a second magnetic body provided on the first magnetic body via a non-magnetic metal layer,
- at least any of the first magnetic body and the second magnetic body is configured by providing a magnetic layer directly above a non-magnetic layer, and
- either the non-magnetic layer or the magnetic layer is formed in a multilayer structure in which different materials are alternately laminated.

(2)

The magnetoresistance effect element according to the above (1), wherein the first magnetic body is configured by providing a first magnetic layer in which different metal materials are alternately laminated directly above a first non-magnetic layer formed of a non-magnetic metal material.

(3)

The magnetoresistance effect element according to the above (2), wherein the non-magnetic metal material forming the first non-magnetic layer contains any of Mo, W, and Ir.

(4)

The magnetoresistance effect element according to the above (2) or (3), wherein a film thickness of the first non-magnetic layer is 0.4 nm or more and 2.2 nm or less.

(5)

The magnetoresistance effect element according to the above (1), wherein the second magnetic body is configured by providing a second magnetic layer formed of a magnetic material containing a 3d transition metal and B directly above a second non-magnetic layer in which a magnetic material containing a 3d transition metal and B and a non-magnetic metal material are alternately laminated.

(6)

The magnetoresistance effect element according to the above (5), wherein the non-magnetic metal material forming one layer of the second non-magnetic layer contains any of Mo, W, and Ir.

(7)

The magnetoresistance effect element according to the above (5) or (6), wherein the second non-magnetic layer is provided in a laminated structure in which at least one of the uppermost layer and the lowermost layer is a layer formed of a non-magnetic metal material.

(8)

The magnetoresistance effect element according to any one of the above (5) to (7), wherein a film thickness of the second non-magnetic layer formed of the non-magnetic metal material is 0.07 nm or more and 0.15 nm or less.

(9)

The magnetoresistance effect element according to any one of the above (5) to (8), wherein a volume ratio between the non-magnetic metal material and the magnetic material containing the 3d transition metal and B in the entire second non-magnetic layer is 48.3%:51.7% to 75.9%:24.1%.

(10)

The magnetoresistance effect element according to any one of the above (1) to (9), wherein the first insulating layer and the second insulating layer are formed of an insulating oxide material.

(11)

The magnetoresistance effect element according to any one of the above (1) to (10), wherein the magnetization free layer includes a magnetic layer formed of a magnetic material containing a 3d transition metal and B.

(12)

The magnetoresistance effect element according to any one of the above (1) to (11), wherein each of the first magnetic body and the second magnetic body further includes a magnetic layer formed of a magnetic metal material.

(13)

A storage element including: a first electrode;
- a magnetization pinned layer that is provided on the first electrode and has a fixed magnetization direction;
- a first insulating layer provided on the magnetization pinned layer;
- a magnetization free layer that is provided on the first insulating layer and has a variable magnetization direction;
- a second insulating layer provided on the magnetization free layer; and
- a second electrode provided on the second insulating layer,
- wherein
- the magnetization pinned layer includes a first magnetic body provided on the first electrode, and a second magnetic body provided on the first magnetic body via a non-magnetic metal layer,
- at least any of the first magnetic body and the second magnetic body is configured by providing a magnetic layer directly above a non-magnetic layer, and
- either the non-magnetic layer or the magnetic layer is formed in a multilayer structure in which different materials are alternately laminated.

(14)

An electronic device including a magnetoresistance effect element,
- the magnetoresistance effect element including: a first electrode; a magnetization pinned layer that is provided on the first electrode and has a fixed magnetization direction; a first insulating layer provided on the magnetization pinned layer; a magnetization free layer that is provided on the first insulating layer and has a variable magnetization direction; a second insulating layer provided on the magnetization free layer; and a second electrode provided on the second insulating layer,
- wherein
- the magnetization pinned layer includes a first magnetic body provided on the first electrode, and a second magnetic body provided on the first magnetic body via a non-magnetic metal layer, at least any of the first magnetic body and the second magnetic body is configured by providing a magnetic layer directly above a non-magnetic layer, and either the non-magnetic layer or the magnetic layer is formed in a multilayer structure in which different materials are alternately laminated.

REFERENCE SIGNS LIST 1, 2, 3, 10, 20, 30 Magnetoresistance effect element
100 Substrate
110 First electrode
120 Magnetization pinned layer
121 First magnetic body
121A First non-magnetic layer
121B First magnetic layer
121C First magnetic metal layer
122 Non-magnetic metal layer
123 Second magnetic body
123A Second magnetic metal layer
123B Second non-magnetic layer
123C Second magnetic layer
130 First insulating layer
140 Magnetization free layer
150 Second insulating layer
160 Second electrode

The invention claimed is:

1. A magnetoresistance effect element comprising: a first electrode;
a magnetization pinned layer that is provided on the first electrode and has a fixed magnetization direction;
a first insulating layer provided on the magnetization pinned layer;
a magnetization free layer that is provided on the first insulating layer and has a variable magnetization direction;
a second insulating layer provided on the magnetization free layer; and
a second electrode provided on the second insulating layer,
wherein
the magnetization pinned layer includes a first magnetic body provided on the first electrode, and a second magnetic body provided on the first magnetic body via a non-magnetic metal layer,
at least any of the first magnetic body and the second magnetic body is configured by providing a magnetic layer directly above a non-magnetic layer, and
the non-magnetic layer is formed in a multilayer structure in which different materials are alternately laminated.

2. The magnetoresistance effect element according to claim 1, wherein the first magnetic body is configured by providing a first magnetic layer in which different metal materials are alternately laminated directly above a first non-magnetic layer formed of a non-magnetic metal material.

3. The magnetoresistance effect element according to claim 2, wherein the non-magnetic metal material forming the first non-magnetic layer contains any of Mo, W, and Ir.

4. The magnetoresistance effect element according to claim 2, wherein a film thickness of the first non-magnetic layer is 0.4 nm or more and 2.2 nm or less.

5. The magnetoresistance effect element according to claim 1, wherein the second magnetic body is configured by providing a second magnetic layer formed of a magnetic material containing a 3d transition metal and B directly above a second non-magnetic layer in which a magnetic material containing a 3d transition metal and B and a non-magnetic metal material are alternately laminated.

6. The magnetoresistance effect element according to claim 5, wherein the non-magnetic metal material forming one layer of the second non-magnetic layer contains any of Mo, W, and Ir.

7. The magnetoresistance effect element according to claim 5, wherein the second non-magnetic layer is provided in a laminated structure in which at least one of the uppermost layer and the lowermost layer is a layer formed of a non-magnetic metal material.

8. The magnetoresistance effect element according to claim 5, wherein a film thickness of the second non-magnetic layer formed of the non-magnetic metal material is 0.07 nm or more and 0.15 nm or less.

9. The magnetoresistance effect element according to claim 5, wherein a volume ratio between the non-magnetic metal material and the magnetic material containing the 3d transition metal and B in the entire second non-magnetic layer is 48.3%:51.7% to 75.9%:24.1%.

10. The magnetoresistance effect element according to claim 1, wherein the first insulating layer and the second insulating layer are formed of an insulating oxide material.

11. The magnetoresistance effect element according to claim 1, wherein the magnetization free layer includes a magnetic layer formed of a magnetic material containing a 3d transition metal and B.

12. The magnetoresistance effect element according to claim 1, wherein each of the first magnetic body and the second magnetic body further includes a magnetic layer formed of a magnetic metal material.

13. A storage element comprising: a first electrode;
a magnetization pinned layer that is provided on the first electrode and has a fixed magnetization direction;
a first insulating layer provided on the magnetization pinned layer;
a magnetization free layer that is provided on the first insulating layer and has a variable magnetization direction;
a second insulating layer provided on the magnetization free layer; and
a second electrode provided on the second insulating layer,
wherein
the magnetization pinned layer includes a first magnetic body provided on the first electrode, and a second magnetic body provided on the first magnetic body via a non-magnetic metal layer,
at least any of the first magnetic body and the second magnetic body is configured by providing a magnetic layer directly above a non-magnetic layer, and
the non-magnetic layer is formed in a multilayer structure in which different materials are alternately laminated.

14. An electronic device comprising a magnetoresistance effect element,
the magnetoresistance effect element including: a first electrode; a magnetization pinned layer that is provided on the first electrode and has a fixed magnetization direction; a first insulating layer provided on the magnetization pinned layer; a magnetization free layer that is provided on the first insulating layer and has a variable magnetization direction; a second insulating layer provided on the magnetization free layer; and a second electrode provided on the second insulating layer, wherein
the magnetization pinned layer includes a first magnetic body provided on the first electrode, and a second magnetic body provided on the first magnetic body via a non-magnetic metal layer,
at least any of the first magnetic body and the second magnetic body is configured by providing a magnetic layer directly above a non-magnetic layer, and
the non-magnetic layer is formed in a multilayer structure in which different materials are alternately laminated.

* * * * *